United States Patent
Musha (10) Patent No.: US 8,400,869 B2
(45) Date of Patent: Mar. 19, 2013

(54) SEMICONDUCTOR MEMORY MODULE

(75) Inventor: Tatsunori Musha, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 197 days.

(21) Appl. No.: 13/023,068

(22) Filed: Feb. 8, 2011

(65) Prior Publication Data

US 2011/0211414 A1 Sep. 1, 2011

(30) Foreign Application Priority Data

Feb. 26, 2010 (JP) ................................. 2010-042594

(51) Int. Cl.
*G11C 8/16* (2006.01)

(52) U.S. Cl. ........... 365/233.13; 365/233.1; 365/233.12; 365/233.18; 365/239; 365/230.06; 365/189.17; 365/189.12

(58) Field of Classification Search ............. 365/233.13, 365/233.1, 233.12, 233.18, 239, 230.06, 365/189.17, 189.12
See application file for complete search history.

(56) References Cited

U.S. PATENT DOCUMENTS

| | | | | |
|---|---|---|---|---|
| 5,963,502 A | * | 10/1999 | Watanabe et al. | 365/233.1 |
| 6,438,055 B1 | * | 8/2002 | Taguchi et al. | 365/222 |
| 6,522,599 B2 | * | 2/2003 | Ooishi et al. | 365/189.15 |
| 6,813,674 B1 | * | 11/2004 | Velasco et al. | 710/311 |
| 8,255,668 B2 | * | 8/2012 | Ohhashi et al. | 711/219 |
| 2009/0198858 A1 | * | 8/2009 | Ban et al. | 710/307 |

FOREIGN PATENT DOCUMENTS

| | | |
|---|---|---|
| JP | 09-091206 A | 4/1997 |
| JP | 10-189889 A | 7/1998 |
| JP | 2003-059272 A | 2/2003 |

* cited by examiner

*Primary Examiner* — Viet Q Nguyen
(74) *Attorney, Agent, or Firm* — Sughrue Mion, PLLC (57) ABSTRACT

A semiconductor device includes a plurality of semiconductor memories, a clock signal synchronization circuit, and a first circuit. The clock signal synchronization circuit is electrically coupled to the plurality of semiconductor memories. The first circuit is electrically coupled to the plurality of semiconductor memories. The first circuit changes a bit width of data. The data is transferred between the first circuit and the plurality of semiconductor memories.

20 Claims, 6 Drawing Sheets

SEMICONDUCTOR MEMORY MODULE

BACKGROUND OF THE INVENTION

1. Field of the Invention

The present invention relates to a semiconductor memory module on which a plurality of semiconductor memories and an interface chip are mounted.

Priority is claimed on Japanese Patent Application No. 2010-042594, Feb. 26, 2010, the content of which is incorporated herein by reference.

2. Description of the Related Art

Recently, synchronous DRAM (SDRAM) synchronized with external clocks has become mainstream in dynamic random access memories (DRAM) which are typical examples of the semiconductor devices. Examples of the synchronous DRAM (SDRAM) may include double data rate (DDR) SDRAM, DDR2 SDRAM and DDR3 SDRAM, to which the DDR technology is introduced in order to perform predetermined operations by synchronizing not only the rising edge of a clock signal but also the falling edge thereof in order to further improve the data transfer rate of the device. In order to realize the DDR technology, two kinds of complementary clock signals are necessary. Here, there are two technologies to generate the two kinds of complementary clock signals. One is that only a first clock signal is supplied from outside the SDRAM and two kinds of internal control clock signals are generated in the SDRAM. The other is that a first clock signal and a second clock signal which has a reverse phase of the first clock signal are supplied from outside the SDRAM and two kinds of internal control clock signals are generated in the SDRAM.

In either technology, the SDRAM utilizing the DDR technology requires a clock signal synchronization circuit that refers to a phase locked loop (PLL) or a delay locked loop (DLL) to synchronize the internal control clock signal to the external clock signal.

Japanese Unexamined Patent Application, First Publication No. JP-A-10-189889 discloses controlling an SDRAM macro chip by a clock signal output from the PLL in the LSI with DRAM (Embedded DRAM).

Japanese Unexamined Patent Application, Second Publication, JP-A-2003-59272 discloses controlling memory banks and I/Os by a clock signal output from the DLL in the SDRAM.

In devices integrating large-capacity semiconductor memories such as personal computers or servers, in order to integrate semiconductor memories at high density, several semiconductor memory modules each having eight to sixteen semiconductor memories like dual inline memory modules (DIMMs) are mounted on a mother board.

Figure 6:
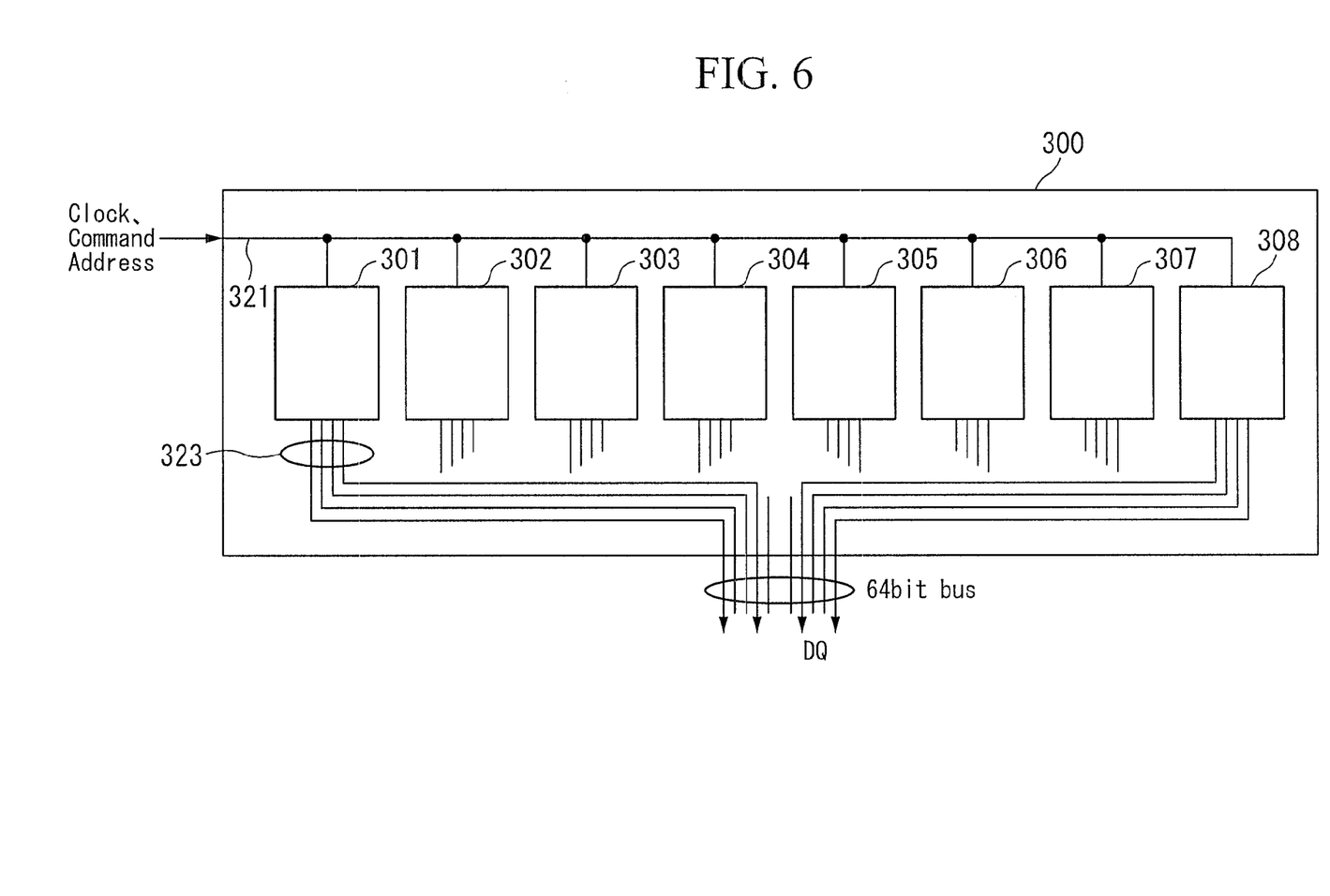
FIG. 6 is a schematic block diagram illustrating the configuration of the semiconductor memory module in accordance with the related art.

FIG. 6 shows a semiconductor memory module 300 according to the related art. The semiconductor memory module 300 has eight semiconductor memories 301 to 308 mounted on the mother board. The eight semiconductor memories are synchronized with clocks which have been input from, for example, an external memory controller via a signal line 321, when the semiconductor memory fetches a command address and performs desired operations.

Further, in data input and output operations, the eight semiconductor memories receive or output an external data signal DQ from or to, for example, external 64-bit bus lines (64 Bit Bus) via a signal line 323 in synchronization with clocks which have been input via the signal line 321.

Japanese Unexamined Patent Application, Third Publication JP-A-9-91206 discloses the memory controller, in which a memory controller with an error correcting code (ECC) function controls four semiconductor memories.

SUMMARY

In one embodiment, a semiconductor device may include, but is not limited to, a plurality of semiconductor memories, a clock signal synchronization circuit, and a first circuit. The clock signal synchronization circuit is electrically coupled to the plurality of semiconductor memories. The first circuit is electrically coupled to the plurality of semiconductor memories. The first circuit changes a bit width of data. The data is transferred between the first circuit and the plurality of semiconductor memories.

In another embodiment, a semiconductor device may include, but is not limited to, a plurality of semiconductor memories and an interface chip electrically coupled in parallel to the plurality of semiconductor memories. The interface chip may include a clock signal synchronization circuit, a dividing circuit, and a parallel-serial conversion circuit. The clock signal synchronization circuit generates a first clock synchronized with an external clock. The dividing circuit receives the first clock from the clock signal synchronization circuit. The dividing circuit generates a second clock from the first clock, the second clock being in synchronism with the first clock. The second clock has a different frequency from that of the first clock. The dividing circuit supplies the second clock to the plurality of semiconductor memories. The parallel-serial conversion circuit is electrically coupled to the plurality of semiconductor memories. The parallel-serial conversion circuit increases a first bit width of data to be transferred to the plurality of semiconductor memories when the semiconductor device is placed in write operation. The parallel-serial conversion circuit decreases a second bit width of data to have been transferred from the plurality of semiconductor memories when the semiconductor device is placed in read operation.

In still another embodiment, a semiconductor device may include, but is not limited to, a plurality of banks, each of the plurality of banks comprising a plurality of semiconductor memories, an interface chip electrically coupled in parallel to the plurality of semiconductor memories, and a boosted voltage generation circuit supplying a boosted voltage to the plurality of the semiconductor memories. The interface chip may include a dividing circuit, a plurality of command decoders, a parallel-serial conversion circuit, an error correcting code circuit, and a bus width switch. The dividing circuit receives the first clock from the clock signal synchronization circuit. The dividing circuit generates a second clock from the first clock. The second clock is in synchronism with the first clock. The second clock has a different frequency from that of the first clock. The dividing circuit supplies the second clock to the plurality of semiconductor memories. Each of the plurality of command decoders corresponds to a corresponding one of the plurality of banks The parallel-serial conversion circuit is electrically coupled to the plurality of semiconductor memories. The parallel-serial conversion circuit increases a first bit width of data to be transferred to the plurality of semiconductor memories when the semiconductor device is placed in write operation. The parallel-serial conversion circuit decreases a second bit width of data to have been transferred from the plurality of semiconductor memories when the semiconductor device is placed in read operation. The error correcting code circuit adds error correction code bit data to data to be written in the plurality of the semiconductor memories. The bus width switch switches a bit number of data to be input into the parallel-serial conversion circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, with reference to drawings, in order to facilitate the understanding of the present invention.

The SDRAM uses the above-described DDR technology since it is necessary that the DLL is synchronized with an external clock signal. The SDRAM constantly consumes a current of about 20 mA. A semiconductor memory module includes a plurality of SDRAMs using the DDR technology since a plurality of the SDRAM chips always operate the DLL. The semiconductor memory module will always consume a current of about 160 mA when eight SDRAMs are mounted thereon as shown in FIG. 6.

In other cases, a semiconductor memory may not use clock synchronization like a SDRAM of the related art. The semiconductor memory is not able to perform a high speed data transmission synchronized with an external clock.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a plurality of semiconductor memories, a clock signal synchronization circuit, and a first circuit. The clock signal synchronization circuit is electrically coupled to the plurality of semiconductor memories. The first circuit is electrically coupled to the plurality of semiconductor memories. The first circuit changes a bit width of data. The data is transferred between the first circuit and the plurality of semiconductor memories.

In some cases, the semiconductor device may include, but is not limited to, the clock signal synchronization circuit is electrically coupled to the first circuit. The clock signal synchronization circuit generates a first clock synchronized with an external clock. The first circuit receives the first clock.

In some cases, the semiconductor device may further include, but is not limited to, a dividing circuit. The dividing circuit receives the first clock from the clock signal synchronization circuit. The dividing circuit generates a second clock from the first clock. The second clock is in synchronism with the first clock. The second clock has a different frequency from that of the first clock.

In some cases, the semiconductor device may include, but is not limited to, the first circuit receiving the second clock from the dividing circuit. The first circuit receives the first clock from the clock signal synchronization circuit. The first circuit operates based on the first and second clocks.

In some cases, the semiconductor device may include, but is not limited to, the first circuit increasing the bit width of the data when the semiconductor device is placed in write operation.

In some cases, the semiconductor device may include, but is not limited to, the first circuit decreasing the bit width of the data when the semiconductor device is placed in read operation.

In some cases, the semiconductor device may include, but is not limited to, the dividing circuit supplying the second clock to the plurality of semiconductor memories.

In some cases, the semiconductor device may include, but is not limited to, the first circuit including a parallel-serial conversion circuit.

In some cases, the semiconductor device may include, but is not limited to, the clock signal synchronization circuit and the first circuit which are integrated on an interface chip.

In some cases, the semiconductor device may include, but is not limited to, the following elements. The plurality of semiconductor memories perform a first burst operation with a first burst length. The first circuit performs a second burst operation with a second burst length. The first burst length is shorter than the second burst length.

In some cases, the semiconductor device may include, but is not limited to, the plurality of semiconductor memories being configured to form a plurality of banks.

In some cases, the semiconductor device may further include, but is not limited to, a boosted voltage generation circuit supplying a boosted voltage to the plurality of the semiconductor memories.

In some cases, the semiconductor device may further include, but is not limited to, a plurality of command decoders. Each of the plurality of command decoders corresponds to a corresponding one of the plurality of banks.

In some cases, the semiconductor device may include, but is not limited to, each of the plurality of command decoders decoding a command to the corresponding one of the plurality of banks The corresponding one is placed in an active mode or a standby mode according to the command.

In some cases, the semiconductor device may further include, but is not limited to, an error correcting code circuit adding error correction code bit data to data to be written in the plurality of the semiconductor memories.

In some cases, the semiconductor device may include, but is not limited to, the following elements. The clock signal synchronization circuit is electrically coupled in parallel to the plurality of semiconductor memories. The first circuit is electrically coupled in parallel to the plurality of semiconductor memories.

In some cases, the semiconductor device may further include, a bus width switch switching a bit number of data to be input into the first circuit.

In another embodiment, a semiconductor device may include, but is not limited to, a plurality of semiconductor memories and an interface chip electrically coupled in parallel to the plurality of semiconductor memories. The interface chip may include a clock signal synchronization circuit, a dividing circuit, and a parallel-serial conversion circuit. The clock signal synchronization circuit generates a first clock synchronized with an external clock. The dividing circuit receives the first clock from the clock signal synchronization circuit. The dividing circuit generates a second clock from the first clock, the second clock being in synchronism with the first clock. The second clock has a different frequency from that of the first clock. The dividing circuit supplies the second clock to the plurality of semiconductor memories. The parallel-serial conversion circuit is electrically coupled to the plurality of semiconductor memories. The parallel-serial conversion circuit increases a first bit width of data to be transferred to the plurality of semiconductor memories when the semiconductor device is placed in write operation. The parallel-serial conversion circuit decreases a second bit width of data to have been transferred from the plurality of semiconductor memories when the semiconductor device is placed in read operation.

In some cases, the interface chip may further include a command decoder decoding a command to at least one of the plurality of semiconductor memories, the at least one of the plurality of semiconductor memories performing an operation according to the command.

In still another embodiment, a semiconductor device may include, but is not limited to, a plurality of banks, each of the plurality of banks comprising a plurality of semiconductor memories, an interface chip electrically coupled in parallel to the plurality of semiconductor memories, and a boosted voltage generation circuit supplying a boosted voltage to the plurality of the semiconductor memories. The interface chip may include a dividing circuit, a plurality of command decoders, a parallel-serial conversion circuit, an error correcting code circuit, and a bus width switch. The dividing circuit receives the first clock from the clock signal synchronization circuit. The dividing circuit generates a second clock from the first clock. The second clock is in synchronism with the first clock. The second clock has a different frequency from that of the first clock. The dividing circuit supplies the second clock to the plurality of semiconductor memories. Each of the plurality of command decoders corresponds to a corresponding one of the plurality of banks The parallel-serial conversion circuit is electrically coupled to the plurality of semiconductor memories. The parallel-serial conversion circuit increases a first bit width of data to be transferred to the plurality of semiconductor memories when the semiconductor device is placed in write operation. The parallel-serial conversion circuit decreases a second bit width of data to have been transferred from the plurality of semiconductor memories when the semiconductor device is placed in read operation. The error correcting code circuit adds error correction code bit data to data to be written in the plurality of the semiconductor memories. The bus width switch switches a bit number of data to be input into the parallel-serial conversion circuit.

Hereinafter, in one embodiment, a DRAM (Dynamic Random Access Memory) as the semiconductor device will be described. In the drawings used for the following description, to facilitate understanding of the embodiments, illustrations are partially enlarged and shown, and the sizes and ratios of constituent elements are not limited to being the same as the actual dimensions. Materials, sizes, and the like exemplified in the following description are just examples, and the invention is not limited thereto and may be appropriately modified within the scope which does not deviate from the embodiments.

First Embodiment

Figure 1:
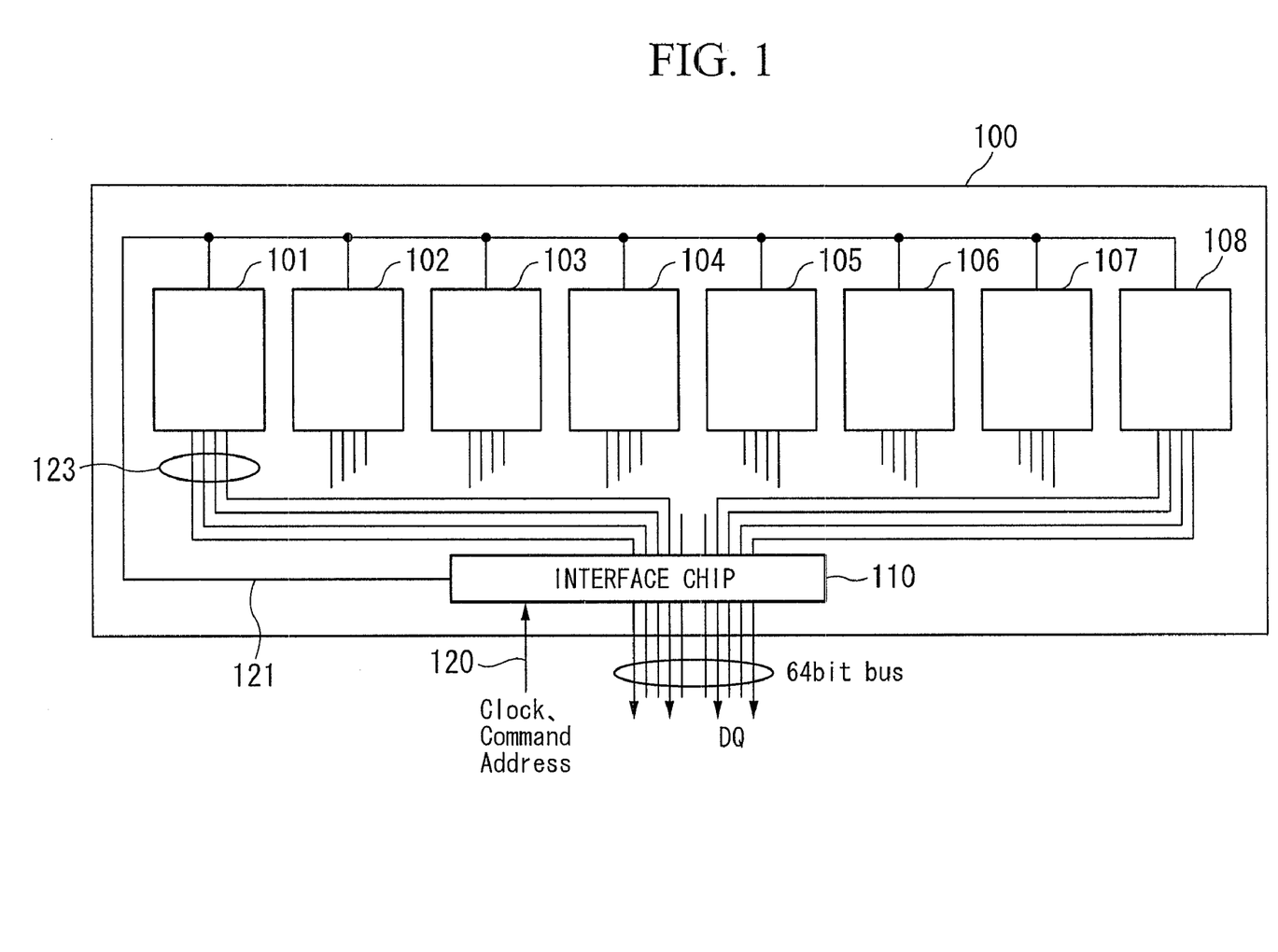
FIG. 1 is a schematic block diagram illustrating the configuration of a semiconductor memory module in accordance with a first embodiment of the present invention.

FIG. 1 is a block diagram of a semiconductor memory module 100 according to the first embodiment of the present invention. Referring to FIG. 1, the semiconductor memory module 100 includes semiconductor memories 101 to 108 and an interface chip 110 for the semiconductor memories 101 to 108.

In the embodiment, the interface chip 110 receives a first clock signal Clock and a first command address signal Command Address supplied from outside the semiconductor memory module 100 via a signal line 120. The interface chip 110 supplies a second clock signal (internal clock CLKd) and a second command address signal (internal command address signal CAd) to the semiconductor memories 101 to 108 via a signal line 121, in response to inputs of the first clock signal Clock and the first command address signal Command Address. The semiconductor memories 101 to 108 exchange data (data signal DQd) with the interface chip 110 via a signal line 123.

Referring to FIG. 1, each of the semiconductor memories 101 to 108 has a 32-bit bus width, and exchanges 32-bit data (data signal DQd) with the interface chip 110 in read and write operations. In the operation according to the read command, the eight semiconductor memories supply 256-bit data to the interface chip 110 via the signal line 123.

The interface chip 110 has, for example, a 64-bit bus width and supplies the 256-bit data to, for example, a memory controller outside the semiconductor memory module 100 when the interface chip 110 performs a 4-bit burst operation, and when the semiconductor memories 101 to 108 perform a 1-bit burst operation and perform 1-bit data output.

Figure 2:
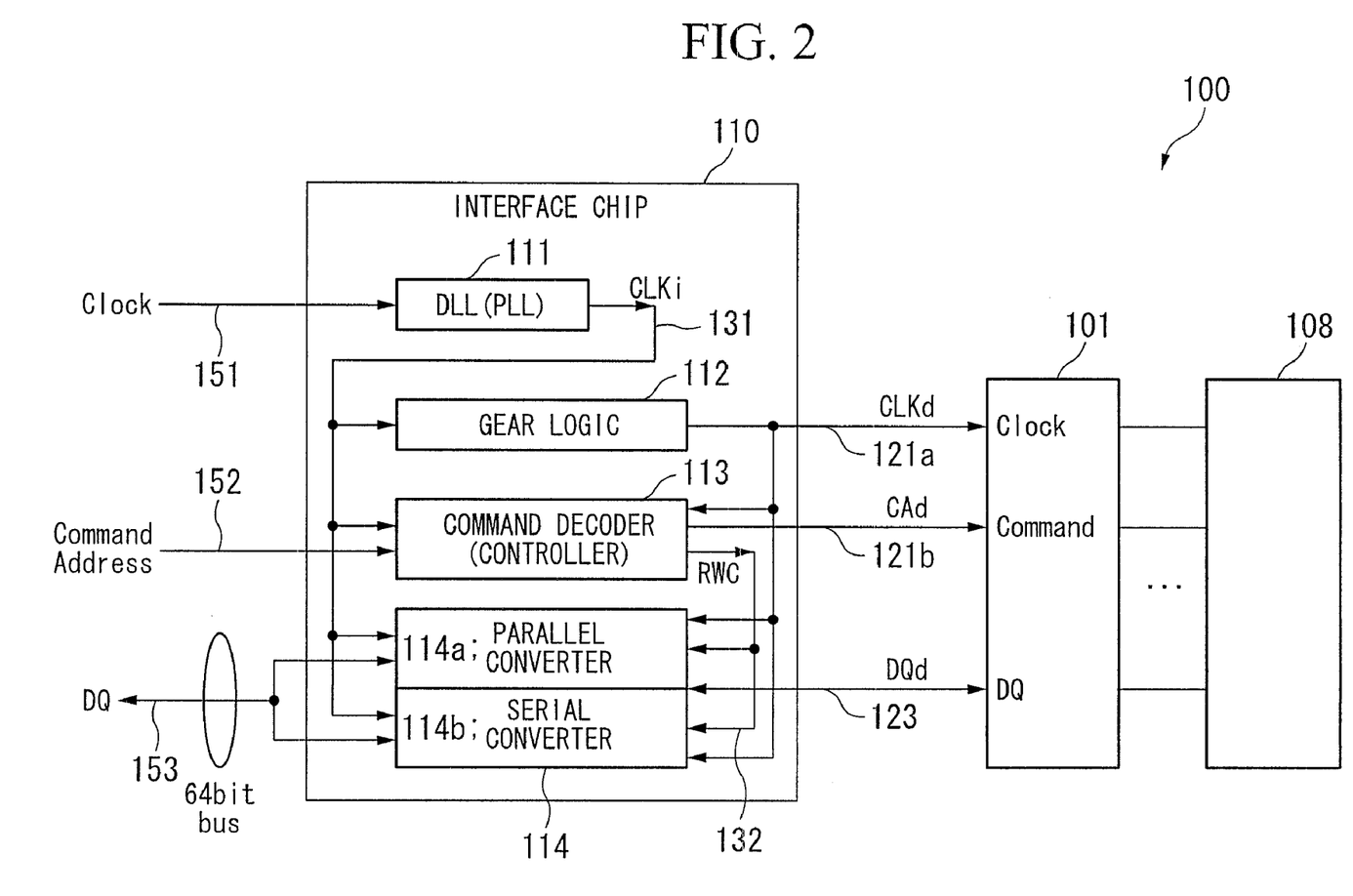
FIG. 2 is a schematic block diagram illustrating interface chip shown in FIG. 1.

FIG. 2 is a block diagram showing configuration of the interface chip 110 in FIG. 1.

The interface chip 110 includes a clock signal synchronization circuit 111, a gear logic 112, a command decoder 113, and a parallel-serial conversion circuit 114.

The clock signal synchronization circuit 111 includes a delay locked loop (DLL) or a phase locked loop (PLL). Here, the DLL generates an output signal without a phase shift from an input signal through a locked loop made by a delay device. Further, the PLL compares a signal output from an internal oscillator with a signal input to the PLL in order to detect erroneous differences in frequency and phase between those signals. The PLL feeds the erroneous differences back to the oscillator to generate an output signal, which is free of any erroneous differences in frequency and phase from the input signal.

In either case of circuit configuration, the clock signal synchronization circuit 111 may be configured to supply a clock signal CLKi via a signal line 151 to a gear logic 112, a command decoder 113, and a parallel-serial conversion circuit 114 via a signal line 131. The clock signal CLKi is synchronized with an external clock Clock which has been input from the memory controller. These circuits perform control operations synchronized with the external clock signal Clock.

The gear logic 112 may include a circuit (dividing circuit) that uses a clock CLKi of a frequency m, to generate an internal clock CLKd of a frequency n. The internal clock CLKd is synchronized with the clock CLKi. The ratio of the frequency n to the frequency m accords to a gear ratio setting point (n/m) which may be set in the gear logic 112 or input from outside the semiconductor memory module.

For example, the gear logic 112 converts the external clock Clock into a lower frequency clock of 100 MHz synchronized with the external clock Clock. The gear logic 112 supplies the converted clock as the internal signal CLKd to the semiconductor memories 101 to 108, the command decoder 113, and the parallel-serial conversion circuit 114 via a signal line 121a when the frequency of the external clock Clock is 400 MHz.

The command decoder 113 latches a command address signal Command Address, which has been input from outside via a signal line 152, in synchronism with the above-described clock CLKi having been input via the signal line 131. Then, the command decoder 113 supplies the latched signal to the semiconductor memories 101 to 108 via a signal line 121b, wherein the latched signal is supplied as an internal command address signal CAd synchronized with the internal clock CLKd. In response to this, the semiconductor memories 101 to 108 fetches commands such as a read command or write command, without using a clock signal synchronization circuit such as a DLL, and the semiconductor memories 101 to 108 perform desired operations according to the inputs of commands. Further, as described above, when the gear logic 112 causes the frequency n of the internal clock CLKd to be (n/m) times with respect to the frequency m of the external clock Clock, the same command and address are input into the command decoder 113 as a command address signal Command Address in a period of time which corresponds to one clock of the external clock Clock. The command decoder 113 supplies the internal command address signal CAd to the semiconductor memories 101 to 108 according to one clock of the internal clock CLKd. One clock of the internal clock CLKd is greater in clock width than one clock of the external clock CLK. In case that the frequency of the internal clock CLKd is a quarter of the frequency of the external clock CLK, the command address signal Command Address, which is input in synchronization with the external clock CLK is maintained to be the unchanged command and address in the period of time which corresponds to four clocks of the external clock CLK. In this case, the command decoder 113 supplies the internal command address signal CAd to the semiconductor memories 101 to 108 according to the single clock of the internal clock CLKd. The parallel-serial conversion circuit 114 includes a parallel converter 114a and a serial converter 114b. The parallel converter 114a receives the 256-bit data signal DQd supplied from the semiconductor memories 101 to 108 via the signal line 123 in the read operation as described above. The parallel converter 114a converts the 256-bit data signal DQd into 64-bit parallel data according to the bus width of a signal line 153. Then, the parallel converter 114a outputs serially four times the 64-bit parallel data in synchronism with the above-described clock CLKi. Further, in the write operation, the serial converter 114b receives four times serial inputs of the 64-bit parallel data as a data signal DQ from the signal line 153 in synchronism with the above-described clock CLKi, wherein the four sets of the 64-bit parallel data correspond to the 256-bit data. The serial converter 114b converts the received data signal DQ into 256-bit parallel data.

The serial converter 114b outputs the data signal DQd which is the converted 256-bit parallel data in synchronism with the internal clock CLKd and the data signal DQd is supplied to the semiconductor memories 101 to 108.

The parallel-serial conversion circuit 114 performs a switching operation between the read and write operations in response to a control signal RWC which has been input from the command decoder 113 via a signal line 132.

Further, when the gear logic 112 changes the frequency n of the internal clock CLKd into (n/m) times with respect to the frequency m of the external clock Clock as described above, the bit width is changed to (n/m) times of the bit width of the external data signal DQ which has been input in synchronism with the external clock. The resultant data signal is supplied from and to the semiconductor memories 101 to 108. Accordingly, in this case, the command decoder 113 supplies the control signal RWC to the parallel-serial conversion circuit 114 according to one clock of the internal clock CLKd corresponding to the (n/m) clock of the external clock Clock. The parallel-serial conversion circuit 114 performs transfer of the data with the bit width which is greater by (n/m) times than the bit width of the external data from or to the semiconductor memories 101 to 108. For example, when the cycle of the internal clock CLKd is, for example, one quarter of the frequency of the external clock Clock, the bit width of the external data signal DQ input in synchronism with the external clock is increased by four times. The resultant data signal is supplied from and to the semiconductor memories 101 to 108. Accordingly, in this case, the command decoder 113 outputs the control signal RWC to the parallel-serial conversion circuit 114 according to one clock of the internal clock CLKd. The parallel-serial conversion circuit 114 performs transfer of the 256-bit data to or from the semiconductor memories 101 to 108.

Further, as described above, the parallel-serial conversion circuit 114 performs read and write operations in synchronism with the internal clock CLKd described above, the read and write operations are performed in cooperation with the semiconductor memories 101 to 108. According to this, the semiconductor memories 101 to 108 can perform input and output operations of the data signal DQd at the timing synchronized with the internal clock CLKd described above, without using any clock signal synchronization circuit such as a DLL.

In conclusion, the interface chip 110 supplies a second clock signal (internal clock CLKd) and a second command address signal (internal command address signal CAd) in common to the semiconductor memories 101 to 108 via the signal line 121, in response to a first clock signal (external clock Clock) and a first command address signal (command address signal Command Address) supplied from outside the semiconductor memory module 200. According to this, the semiconductor memories 101 to 108 receive the internal command address signal CAd input in synchronization with the internal clock CLKd and perform an operation in response to the address and command. Further, when a write or read command is generated, a data (data signal DQd) exchange is performed between the interface chip 110 and the semiconductor memories 101 to 108 via the signal line 123 in synchronism with the internal clock CLKd. Further, the semiconductor memories 101 to 108 perform these operations without using the clock signal synchronization circuit such as a DLL.

In the read operation, the interface chip 110 converts the data signal DQd input from the semiconductor memories 101 to 108 via the signal line 123 into 64-bit width according to the bus width of the signal line 153 using the 4-bit parallel-serial conversion circuit 114 (parallel converter 114a and serial converter 114b). Then, the interface chip 110 supplies the external data signal DQ to the outside via the signal line 153 in synchronism with the external clock Clock.

As such, the semiconductor memory module (semiconductor memory module 100) of the present embodiment includes a plurality of semiconductor memories (semiconductor memories 101 to 108) and an interface chip (interface chip 110), which receives and outputs first data (external data signal DQ) from and to outside. When the interface chip operates n response to a read or write command, the interface chip generates a second clock (internal clock Clock) synchronized with a first clock (external clock Clock) input from outside, and supplies the generated clock to the plurality of semiconductor memories. Further, the interface chip exchanges the second data (data signal DQd) obtained by changing the bit width of the first data with the plurality of semiconductor memories.

Thus, the semiconductor memories can perform operation in synchronism with an internal clock (internal clock CLKd) of a low frequency supplied from the interface chip, without using a clock signal synchronization circuit such as a DLL. The interface chip performs operation with the outside in synchronism with the external clock (external clock Clock). Accordingly, the semiconductor memories do not require the integrated clock signal synchronization circuit such as the DLL described above and thus current consumption can be reduced. For example, compared to the semiconductor memory module in the related art which has 8 DDR2SDRAMs mounted thereon each having a DLL, the semiconductor memory module of the present embodiment having a single DLL integrated on the interface can obtain an effect to reduce about 90% of consumption current needed to operate the DLL. Accordingly, there are effects that consumption current of the semiconductor memory module can be reduced compared to the semiconductor memory module in the related art.

Further, the semiconductor memory module generates first data by converting the bit width of the second data (data signal DQd). Namely, the semiconductor memory module has the parallel-serial conversion circuit 114 described above. Therefore, it is possible to increase the number of bits that transmit data in the unit time and to perform high speed data transmission in synchronism with the external clock.

In accordance with the above-described example, the frequency of the internal clock is converted into a low frequency of 100 MHz, and 4-bit burst read operation is performed. Therefore, data transmission speed is substantially equivalent to 400 MHz. Thus, it is possible to achieve high speed data transmission.

Figure 3:
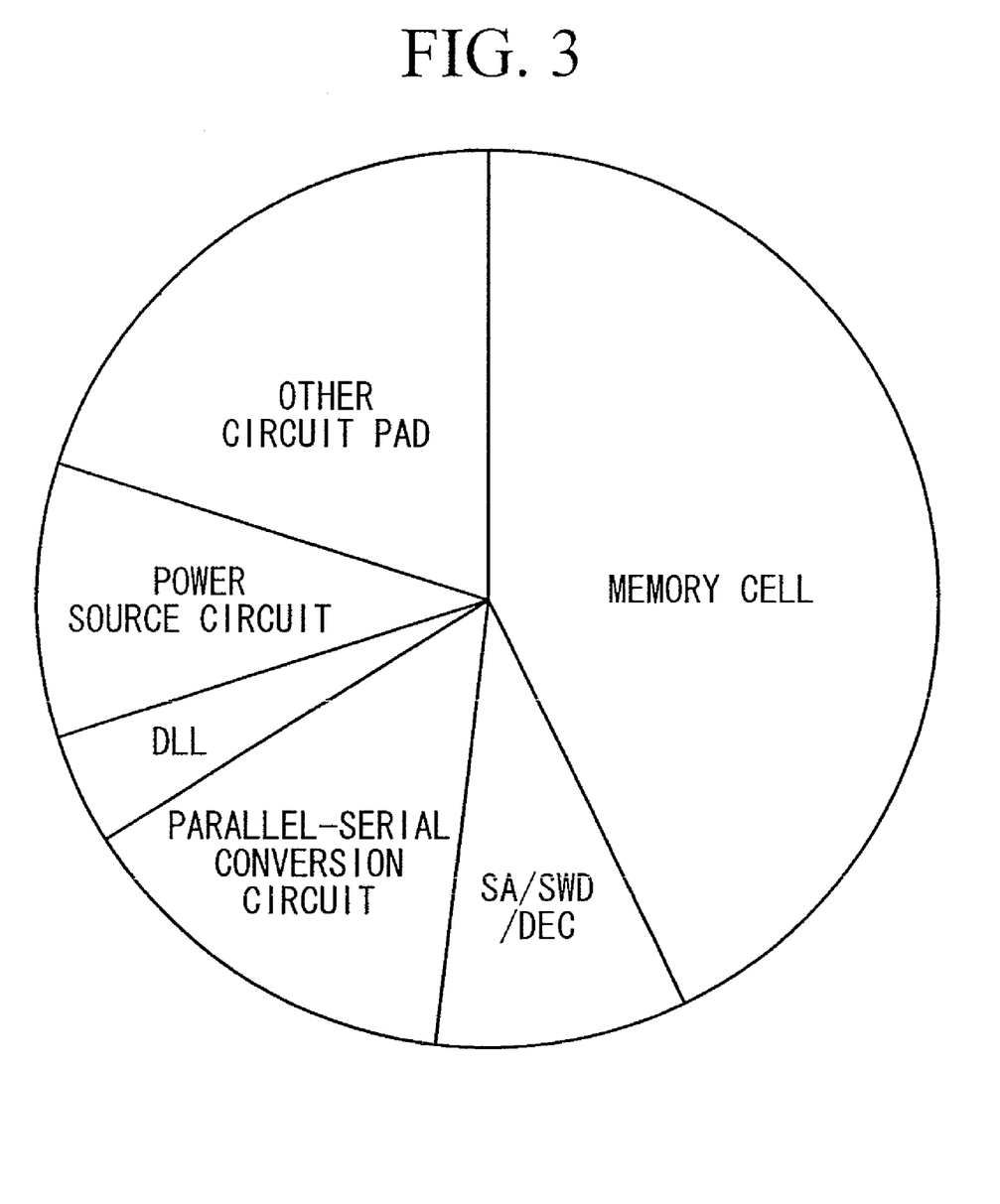
FIG. 3 is a graph showing occupation ratio of the semiconductor memory module shown in FIG. 1.

In addition, when considered based on a circuit occupation ratio of DDR2 having a DLL and parallel-serial conversion circuit, as shown in FIG. 3, the semiconductor memories 101 to 108 do not need the DLL and parallel-serial conversion circuit. Therefore, there is an effect that the chip size can be reduced about 20% compared to that of the DDR2 in the related art.

Further, while 4-bit burst is used in the example described above, an operation using 8-bit burst is explained as follows. The semiconductor memories 101 to 108 are operated in 2-bit burst. One clock of the internal clock CLKd is generated via the signal line 121a in every four clock signals of the clock CLKi input via the signal line 131. Then, an exchange of data signal DQd between the parallel-serial conversion circuit 114 and semiconductor memories 101 to 108 is performed two times. In this case, the semiconductor memories 101 to 108 are set to a 2-bit burst operation. Even if a burst length of bits becomes long, one clock of the internal clock CLKd is generated in every four clocks of the clock CLKi in the same manner. An exchange of the data signal DQd between the parallel-serial conversion circuit 114 and semiconductor memories 101 to 108 is performed in the number of times the internal clock CLKd is generated. Further, a burst length of the semiconductor memories 101 to 108 is set to "burst length of bit/4".

Second Embodiment

A second embodiment of the present invention will be described using FIGS. 4 and 5.

Figure 4:
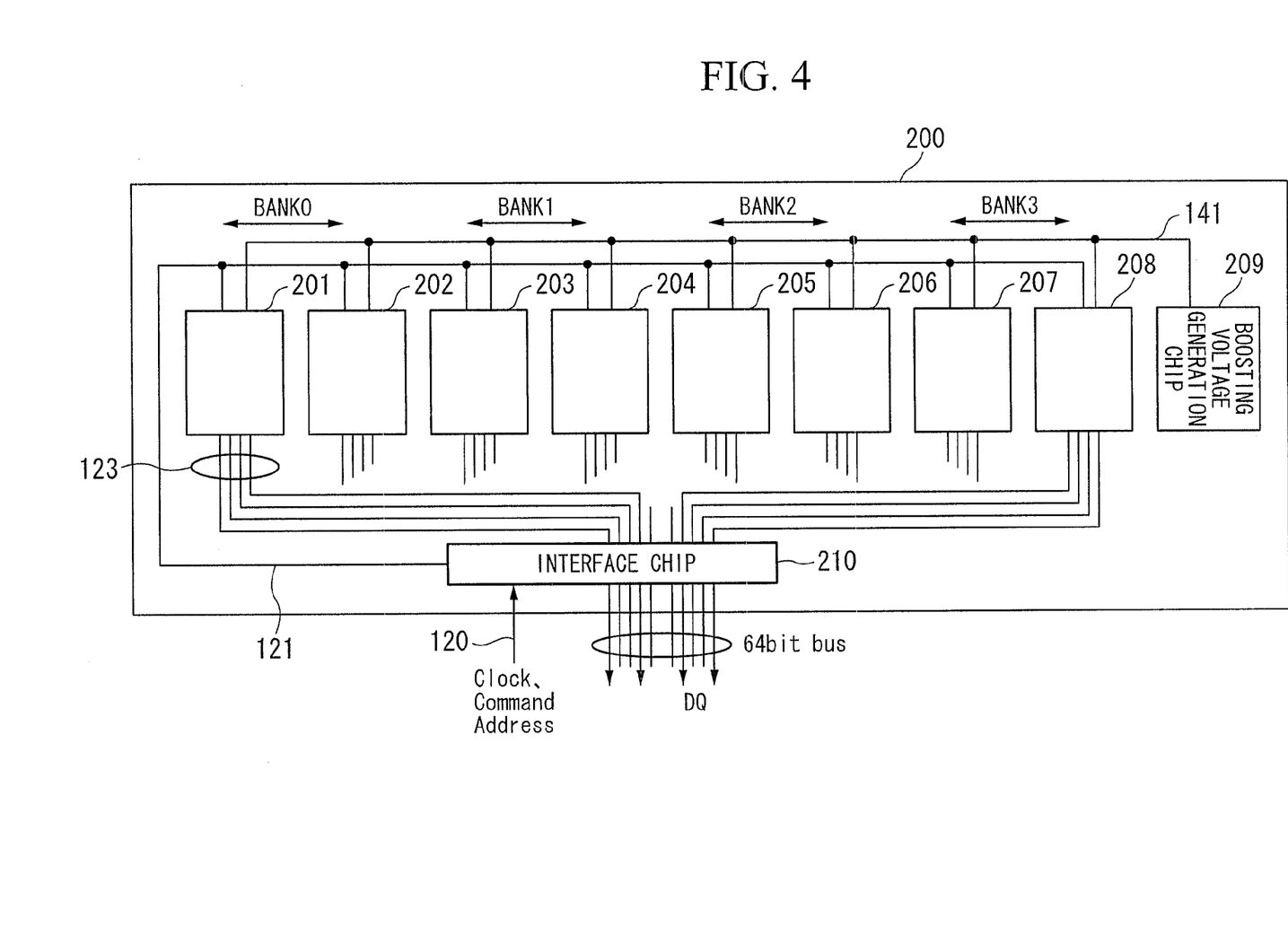
FIG. 4 is a schematic block diagram illustrating the configuration of a semiconductor memory module in accordance with a second embodiment of the present invention.

FIG. 4 is a block diagram of a semiconductor memory module 200 in accordance with an embodiment of the present invention.

In FIG. 4, the same elements as in FIG. 1 are assigned the same numerals. The semiconductor memory module 200 includes dedicated memories 201 to 208, an interface chip 210, and a boosted voltage generation chip 209. Here, the dedicated memory 201 is different from the semiconductor memory 101 in the first embodiment described above as follows.

In some cases, two of the dedicated memories 201 to 208 form a bank. Here, the bank refers to a memory cell area of a desired unit in the semiconductor memory, in which a data read operation and a data write operation are not exclusively controlled with each other but can be executed independently. For example, the data read operation and the data write operation are performed between banks in an arbitrary timing.

Therefore, the semiconductor memory module 200 of the present embodiment constructs a bank 0 (BANK0) with the dedicated memory 201 and the dedicated memory 202, a bank 1 (BANK 1) with the dedicated memory 203 and the dedicated memory 204, a bank 2 (BANK 2) with the dedicated memory 205 and the dedicated memory 206, and a bank 3 (BANK 3) with the dedicated memory 207 and the dedicated memory 208, and is controlled by the interface chip 210.

Next, the dedicated memories 201 to 208 do not include a booster circuit.

The semiconductor memory has an element which requires a high voltage operation. For example, in the DRAM, a voltage supplied to a control terminal of a transistor used to select a memory cell, that is, a word line driving voltage, requires a boosted voltage VPP. This is because the effect caused by a threshold value of the transistor for selecting the memory cell configured of an N-type MOS transistor is cancelled. However, when a voltage level of an external source voltage becomes a lower level, it becomes difficult to generate a boosted voltage.

Therefore, the dedicated memories 201 to 207 does not include the booster circuit, and the boosted voltage generation chip 209 mounted on the semiconductor memory module 200 supplies the boosted voltage through a power line 141.

Further, the dedicated memories 201 to 207 have a multiple bit construction, compared to the semiconductor memories 101 to 107 described above. For example, the dedicated memories 201 to 207 receive and generate 128-bit data as a data signal DQd, and exchange it with the interface chip 210 via a signal line 123. Further, the interface chip 210 converts 128-bit width into 64-bit width, and receives and generates the external data signal DQ from and to outside.

Figure 5:
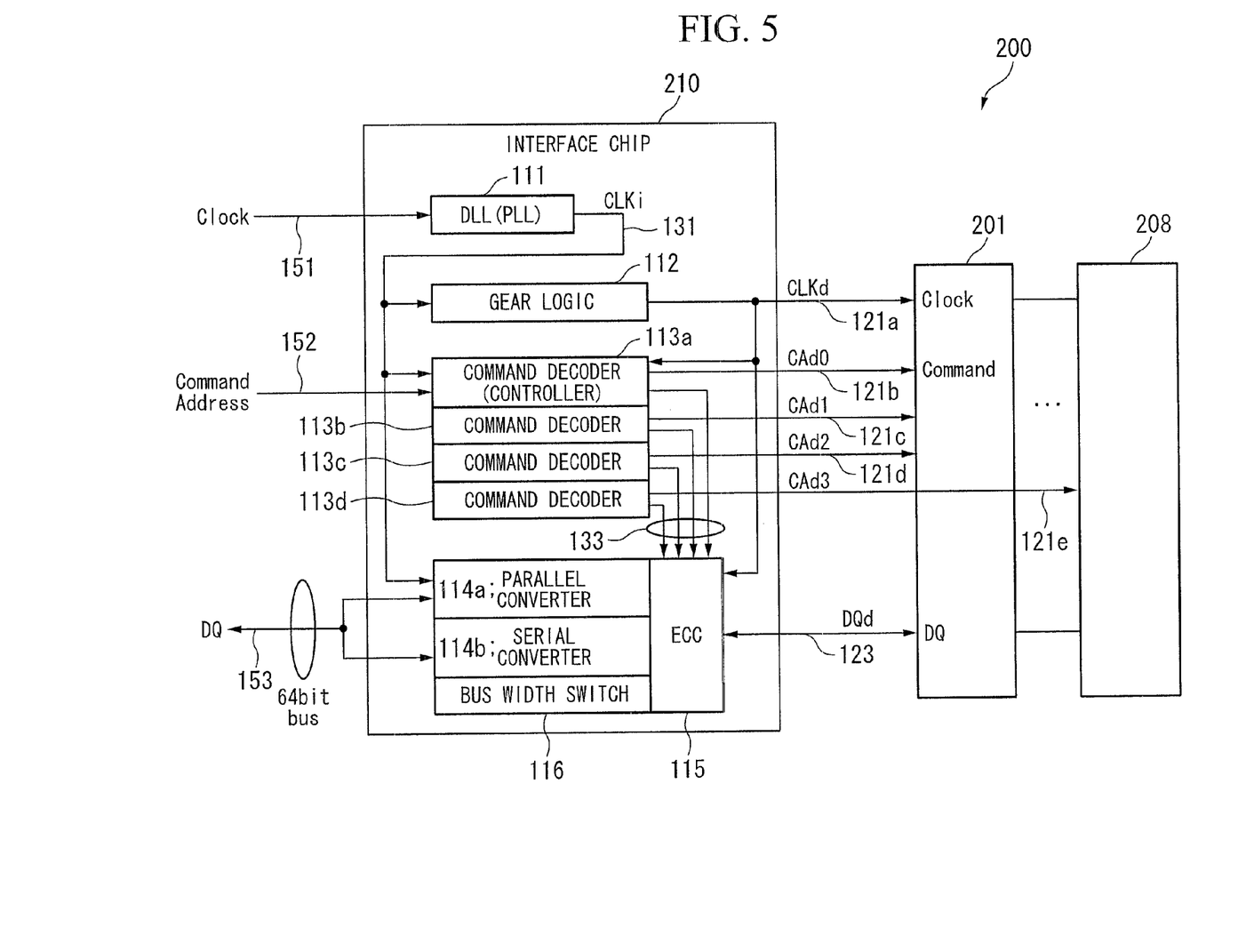
FIG. 5 is a schematic block diagram illustrating interface chip shown in FIG. 4.

FIG. 5 is a block diagram showing a detailed construction of the interface chip 210 of FIG. 4.

The interface chip 210 is different from the interface chip 110 in the first embodiment described above as follows.

First, the interface chip 210 includes command decoders 113a to 113d corresponding to the banks 0 to 3.

The command decoders 113a to 113d output internal command address signals CAd0 to CAd3 to the banks 0 to 3 via signal lines 121b to 121e and control each bank, in response to a command address signal Command Address input from a signal line 152. For example, the command decoder 113a controls to set the bank 0 (dedicated memories 201 and 202) to a page (burst) operation mode. The command decoders 113b to 113d control to set the other banks 1 to 3 to a standby mode in which consumption current is small (consumption current IDD2 mode) or to a RASB LOW standby mode (consumption current IDD3 mode).

Next, the interface chip 210 includes an ECC circuit 115. Here, ECC is an error correcting code, which is redundant data added separately from original data in order to correct a data error when reading data from the memory.

The ECC circuit 115 adds ECC bit data (parity bit) to data to be stored, which is input from the serial converter 114b, in response to an error correction starting signal input from the command decoder 113 via a signal line 133 in the write operation. Then, the ECC circuit 115 outputs a data signal DQd to the dedicated memory via a signal line 123. Further, in the read operation, the ECC circuit 115 processes the written data input from the dedicated memory via the signal line 123 and added ECC bit data in response to the error correction starting signal. Thereby, the ECC circuit 115 detects and corrects erroneous data bits, and outputs the corrected data to the parallel converter 114a.

Further, the interface chip 210 includes a bus width switch 116. As described above, each of the banks 0 to 3 has 128 bits as a bit width and is independently controlled by the command decoders 113a to 113d. In a continuous read operation of the bank, temporary data is also read from, for example, the four banks. At that time, in order to adjust a gap occurring in the data signal DQd output via the signal line 123, the bus width switch 116 switches the number of data bits input to the parallel converter 114a described above. Further, the bus width switch 116 may be configured as follows when the dedicated memories 201 to 208 can be set to a reduction test mode. The 128-bit output data described above is reduced and each bank is assigned to each data signal DQd, and each the data signal DQd is output to the converter 114a.

According to the above-described construction, the interface chip 210 generates a second clock signal (internal clock CLKd) and a second command address signal (internal command address signals CAd 0 to 3) using the command decoders 113a to 113d in response to a first clock signal (external clock Clock) and a first command address signal (command address signal Command Address) supplied from the outside of the semiconductor memory module 200. The interface chip 210 independently supplies the generated signals to the banks 0 to 3 via the signal lines 121a to 121d. Thereby, in synchronism with the internal clock CLKd, each of the banks 0 to 3 receives an address and a command using each of the internal command address signal CAd 0 to 3 and performs an operation in response to the command. Further, when a write or read command is input, each of the banks 0 to 3 exchanges data (data signal DQd) with the interface chip 110 via the signal line 123 in synchronism with the internal clock CLKd.

In the interface chip 210, the parallel-serial conversion circuit 114 (parallel converter 114a and serial converter 114b) adjusts data input and output from the ECC circuit 115 to the bus width of the signal line 153 in the read operation to the bus width of the signal line 153. Then, the parallel-serial conversion circuit 114 outputs the data as an external data signal DQ to the outside via the signal line 153.

As such, the semiconductor memory module (semiconductor memory module 200) of the present embodiment includes a plurality of semiconductor memories (dedicated memories 201 to 208) and an interface chip (interface chip 210), which is a semiconductor memory module that receives and outputs the first data (external data signal DQ) from and to the outside. In an operation in response to a read or write command, the interface chip generates a second clock (internal clock CLKd) synchronized with a first clock signal (external clock Clock) input externally. The interface chip supplies the generated clock to the plurality of semiconductor memories. The interface chip exchanges the second data (data signal DQd) made by changing the bit width of the first data with the plurality of semiconductor memories.

Further, the interface chip (interface chip 210) includes a dividing circuit (gear logic 112) and a parallel-serial conversion circuit (parallel converter 114a and serial converter 114b). The dividing circuit (gear logic 112) generates a second clock of a low frequency (internal clock CLKd) synchronized with a first clock (external clock Clock). The parallel-serial conversion circuit (parallel converter 114a and serial converter 114b) that generates second data (data signal DQd) by converting a bit width of first data (external data signal DQ).

Further, the plurality of semiconductor memories (dedicated memories 201 to 208) are configured of a plurality of banks (banks 0 to 3). The plurality of banks independently operate in response to the command address signal (command address signal Command Address).

Further, the interface chip (interface chip 210) further includes an error correction circuit (ECC115). The error correction circuit corrects an error of second data (data signal DQd) input from a plurality of memories (dedicated memories 201 to 208). The error correction circuit outputs corrected data to a parallel-serial conversion circuit (parallel-serial conversion circuit 114) as second data (data signal DQd).

Further, the semiconductor memory module (semiconductor memory module 200) further includes a boosted voltage generation chip (boosted voltage generation chip 209). The boosted voltage generation chip supplies a boosted voltage to the plurality of semiconductor memories.

Accordingly, the semiconductor memory module 200 further has the followings effects while maintaining the above-described effect.

The semiconductor memory module 200 has 4 banks and operation of each bank is controlled by the command decoders 113a to 113d. Therefore, since all chips do not enter the same operation mode, consumption current of the semiconductor memory module can be further reduced.

Further, it is unnecessary for the semiconductor memory constituting each bank to include a boosting source circuit. For example, when considered based on circuit occupation ratio of DDR2 shown in FIG. 3 which was referred before, the source circuit portion in FIG. 3 can be further reduced, such that chip size of the dedicated memory, as well as the DLL or the parallel-serial conversion circuit portion described above, can be reduced about 30% compared to the DDR2 in the related art.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

It is apparent that the present invention is not limited to the above embodiments, but may be modified and changed without departing from the scope and spirit of the invention.

What is claimed is:

1. A semiconductor device:
   a plurality of semiconductor memories;
   a clock signal synchronization circuit electrically coupled to the plurality of semiconductor memories; and
   a first circuit electrically coupled to the plurality of semiconductor memories, the first circuit changing a bit width of data, the data being transferred between the first circuit and the plurality of semiconductor memories,
   wherein the clock signal synchronization circuit is electrically coupled to the first circuit,
   wherein the clock signal synchronization circuit generates a first clock synchronized with an external clock, and
   wherein the first circuit receives the first clock.

2. The semiconductor device according to claim 1, further comprising:
   a dividing circuit receiving the first clock from the clock signal synchronization circuit, the dividing circuit generating a second clock from the first clock, the second clock being in synchronism with the first clock, and the second clock having a different frequency from that of the first clock.

3. The semiconductor device according to claim 2, wherein the first circuit receives the second clock from the dividing circuit,
   wherein the first circuit receives the first clock from the clock signal synchronization circuit, and
   wherein the first circuit operates based on the first and second clocks.

4. The semiconductor device according to claim 3, wherein the first circuit increases the bit width of the data when the semiconductor device is placed in write operation.

5. The semiconductor device according to claim 3, wherein the first circuit decreases the bit width of the data when the semiconductor device is placed in read operation.

6. The semiconductor device according to claim 2, wherein the dividing circuit supplies the second clock to the plurality of semiconductor memories.

7. The semiconductor device according to claim 1, wherein the first circuit comprises a parallel-serial conversion circuit.

8. The semiconductor device according to claim 1, wherein the clock signal synchronization circuit and the first circuit are integrated on an interface chip.

9. The semiconductor device according to claim 1, wherein the plurality of semiconductor memories perform a first burst operation with a first burst length, the first circuit performs a second burst operation with a second burst length, the first burst length is shorter than the second burst length.

10. The semiconductor device according to claim 1, further comprising:
    a plurality of command decoders, each of the plurality of command decoders corresponding to a corresponding one of a plurality of memory banks.

11. The semiconductor device according to claim 10, wherein each of the plurality of command decoders decodes a command to the corresponding one of the plurality of banks, the corresponding one is placed in an active mode or a standby mode according to the command.

12. The semiconductor device according to claim 1, further comprising:
    a bus width switch switching a bit number of data to be input into the first circuit.

13. A semiconductor device comprising:
    a plurality of semiconductor memories; and
    an interface chip electrically coupled in parallel to the plurality of semiconductor memories,
    wherein the interface chip comprises:
    a clock signal synchronization circuit generating a first clock synchronized with an external clock;
    a dividing circuit receiving the first clock from the clock signal synchronization circuit, the dividing circuit generating a second clock from the first clock, the second clock being in synchronism with the first clock, and the second clock having a different frequency from that of the first clock, the dividing circuit supplying the second clock to the plurality of semiconductor memories; and
    a parallel-serial conversion circuit electrically coupled to the plurality of semiconductor memories, the parallel-serial conversion circuit increasing a first bit width of data to be transferred to the plurality of semiconductor memories when the semiconductor device is placed in write operation, the parallel-serial conversion circuit decreasing a second bit width of data to have been transferred from the plurality of semiconductor memories when the semiconductor device is placed in read operation.

14. The semiconductor device according to claim 13, wherein the interface chip further comprises:
    a command decoder decoding a command to at least one of the plurality of semiconductor memories, the at least one of the plurality of semiconductor memories performing an operation according to the command.

15. A semiconductor device comprising:
    a plurality of banks, each of the plurality of banks comprising a plurality of semiconductor memories;
    an interface chip electrically coupled in parallel to the plurality of semiconductor memories; and
    a boosted voltage generation circuit supplying a boosted voltage to the plurality of the semiconductor memories,
    wherein the interface chip comprises:
    a clock signal synchronization circuit generating a first clock synchronized with an external clock;
    a dividing circuit receiving the first clock from the clock signal synchronization circuit, the dividing circuit generating a second clock from the first clock, the second clock being in synchronism with the first clock, and the second clock having a different frequency from that of the first clock, the dividing circuit supplying the second clock to the plurality of semiconductor memories;
    a plurality of command decoders, each of the plurality of command decoders corresponding to a corresponding one of the plurality of banks;
    a parallel-serial conversion circuit electrically coupled to the plurality of semiconductor memories, the parallel-serial conversion circuit increasing a first bit width of data to be transferred to the plurality of semiconductor memories when the semiconductor device is placed in write operation, the parallel-serial conversion circuit decreasing a second bit width of data to have been transferred from the plurality of semiconductor memories when the semiconductor device is placed in read operation;
    an error correcting code circuit adding error correction code bit data to data to be written in the plurality of the semiconductor memories; and
    a bus width switch switching a bit number of data to be input into the parallel-serial conversion circuit.

16. A semiconductor device comprising:
a plurality of semiconductor memory chips; and
an interface chip electrically coupled to each of the semiconductor memory chips, the interface chip comprising:
a clock signal synchronization circuit receiving an external clock and generating a first internal clock that is synchronized with the external clock;
a first set of data terminals;
a second set of data terminals electrically coupled to the semiconductor memory chips; and
a parallel-serial conversion circuit electrically coupled between the first and second sets of data terminals, the parallel-serial conversion circuit being electrically coupled to the clock signal synchronization circuit to receive the first internal clock and performing, in response to the first internal clock, a serial-to-parallel conversion operation on data supplied in series to the first set of data terminals and a parallel-to-serial conversion operation on data supplied in parallel to the second set of data terminals from the semiconductor memory chips.

17. The device as claimed in claim 16, wherein the clock signal synchronization circuit comprises one of a DLL circuit and a PLL circuit.

18. The device as claimed in claim 16, wherein the data supplied in series to the first set of data terminals are converted into parallel data by the serial-to-parallel conversion operation of the parallel-serial circuit, the parallel data being transferred to the semiconductor memory chips through the second set of data terminals, and the data supplied in parallel to the second set of data terminals from the semiconductor memory chips are converted into serial data by the parallel-to-serial conversion operation of the parallel-serial circuit, the serial data being transferred to the first set of data terminals.

19. The device as claimed in claim 18, wherein the second set of data terminals is greater in number than the first set of data terminals so that the data supplied in series to the first set of data terminals are smaller in number of bits than the data supplied in parallel to the second set of data terminals from the semiconductor memory chips.

20. The device as claimed in claim 17,
wherein the interface chip further comprises a clock circuit generating a second internal clock that is lower in frequency than the internal clock,
wherein the data supplied in series to the first set of data terminals are converted into parallel data by the serial-to-parallel conversion operation of the parallel-serial circuit responsive to the first internal clock, the parallel data being transferred to the semiconductor memory chips through the second set of data terminals in response to the second internal clock, and
wherein the data from the semiconductor memory chips are supplied in parallel to the second set of data terminals in response to the second internal clock and are converted into serial data by the parallel-to-serial conversion operation of the parallel-serial circuit responsive to the first internal clock, the serial data being transferred to the first set of data terminals.

* * * * *